United States Patent [19]

Wright

[11] 4,334,212

[45] Jun. 8, 1982

[54] ELECTRONIC LATCH FOR DIGITALLY ACTUATING A LOAD

[76] Inventor: Fred R. Wright, 3620 Bluff Pl. #2, San Pedro, Calif. 90731

[21] Appl. No.: 77,599

[22] Filed: Sep. 21, 1979

[51] Int. Cl.$^3$ ............................................. H03K 13/02
[52] U.S. Cl. .............................. 340/347 DA; 307/465; 340/347 M
[58] Field of Search .......................... 328/37; 307/215; 340/347 DD, 347 DA

[56] References Cited

U.S. PATENT DOCUMENTS 4,058,773 11/1977 Clark et al. ............................. 328/37
4,087,811 5/1978 Weinberger ................. 340/347 DD Primary Examiner—Thomas J. Sloyan
Attorney, Agent, or Firm—Edward J. DaRin

[57] ABSTRACT

An arrangement of bistable data latches useful with a digital to analog converter for controlling the light output of a lamp. The data latches are provided with individual touch sensitive selection elements for controlling the pattern of binary signals generated at the output of the latches to define the voltage available for energizing the lamp or load. The selection elements may be operated in sequence or at random to select the desired output.

7 Claims, 7 Drawing Figures

$$q_N \approx S'_N = S_N + S'_{N-1} + (\overline{R_N \cdot R'_{N+1}} \cdot S'_N)$$
$$\overline{q_N} \approx R'_N = R_N + R'_{N+1} + (\overline{S_N \cdot S'_{N-1}} \cdot R'_N)$$

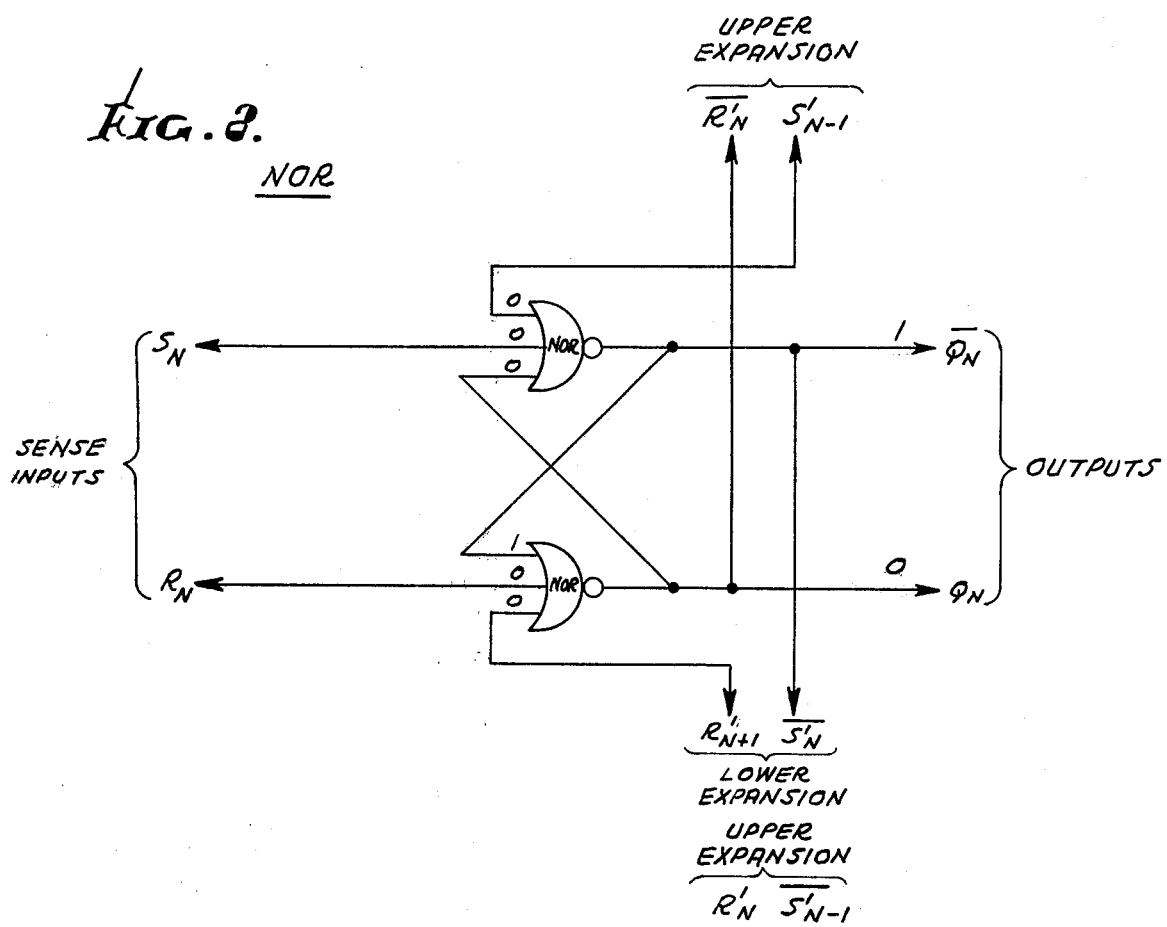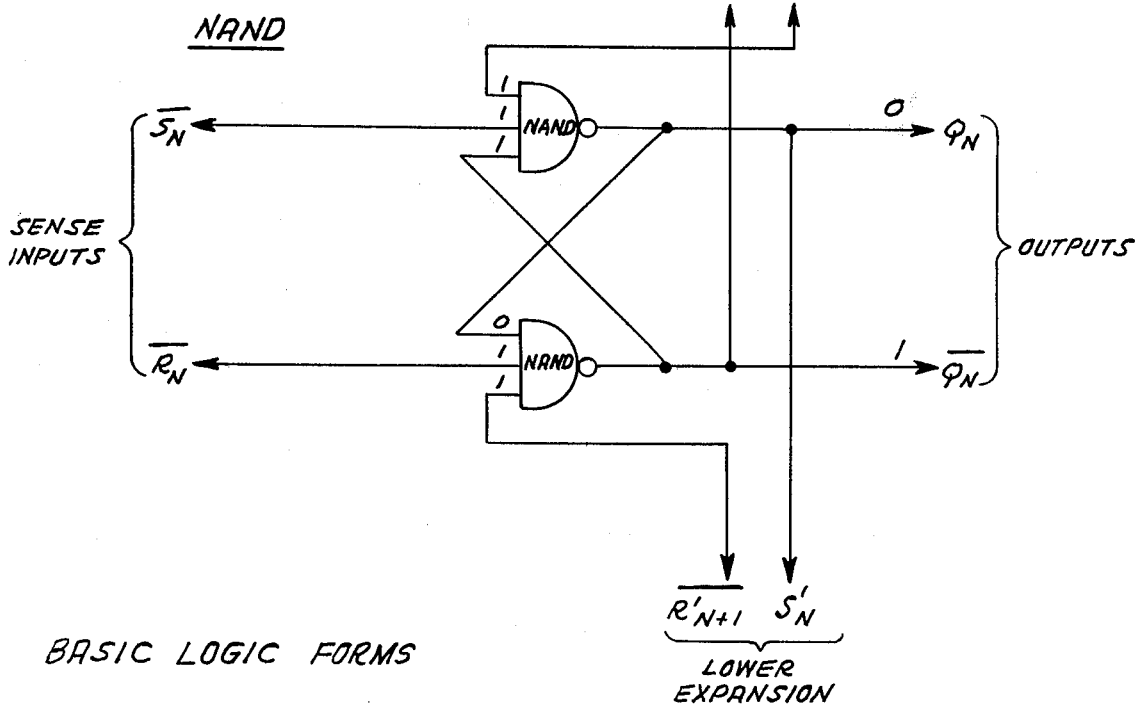
Fig. 2.
BASIC LOGIC FORMS

ELECTRONIC LATCH FOR DIGITALLY ACTUATING A LOAD

BACKGROUND OF THE INVENTION

Various types of switching circuits are presently known in the prior art, which includes mechanical switching circuits, electronic switching circuits, and touch control switching elements. When compared to conventional mechanical switching elements, a touch control element provides a switch that has the advantages of quiet and reliable operation, spark-free operation, and extreme ease of operation by merely touching a contact or selection element. Stated differently, a switching signal is generated in response to the touch by an individual. Touch control switching elements do not incorporate any moveable mechanical parts that result in wear and, therefore, a long life is generally experienced for such elements. Touch sensitive elements are extensively used in elevators to permit an individual to select the floor level that it is desired the elevator should travel. The disadvantages to the use of a touch control switch element are that they include a higher initial cost and are difficult to apply in those applications that require a nearly continuous, rapid response, such as that provided by an electrical potentiometer, for example. The function of an electrical potentiometer has been attempted using counters, which are generally expensive and slow, or storing an electrical charge on a capacitor. The storage of an electrical charge on a capacitor is generally accompanied with the loss of charge, or a slow discharging action with time.

At the present time there is a need for a low cost form of digital logical circuitry that is useful in switching applications and can be utilized to simulate the control function of potentiometer when combined with appropriate digital to analog conversion techniques for controlling the application of power to a load, for example. The provision of such a "logical" switching circuit permits a touch sensitive control element to be utilized and which would allow a large number of control steps to be defined by the "logical" circuitry for controlling the application of electrical power to a load. When a large number of selection elements are desired to provide a large number of "logical" unique outputs, the physical space that is permitted for such a control unit may be relatively small. If such a "logical" control unit is utilized, for example, in controlling the voltage applied to a load or a lamp to function as a selection switch to control the desired light output from the lamp, the selection elements may be so close together that two or more adjacent sensors could be actuated at the same time when the touch sensitive element is actuated by an individual's finger. Accordingly, the touch sensitive element utilized in combination with "logical" circuitry should permit a preselected amount of hysteresis to be incorporated therein to overcome the problem of actuating a plurality of touch sensitive elements at the same time.

The present invention provides a "logical" data latch that is capable of detecting momentary, triggering, signals applied to its input terminals and providing a unique, latched binary output pattern or code in response to the selected latching element. The pattern of binary coded signals generated is responsive to the operation of an individual control or selection element that activates preselected logical elements in combination with the previous "logical" condition of the "logical" data latches. The "logical" data latches can be combined with touch sensitive selection control elements to effectively control the light output of a lighting device whereby the light output can be selected through the operation of sequentially arranged selection elements, or at random, to achieve the desired light output.

The basic element for the data latch of the present invention comprises a bistable latching element having at least a pair of preselected "logical" elements for defining setting and resetting portions of the bistable element. One "logical" element has a pair of input terminals coupled to be responsive to an individual binary coded triggering signal for "setting" the latching element to a preselected one of its bistable states in response to a triggering signal coupled to either one of said input terminals. The aforementioned "logical" element has an output terminal coupled thereto for signalling one of the two bistable states in accordance with the "logical" combination of the binary coded signals received at the input terminals thereof. The electronic latch includes another "logical" element having an individual pair of input terminals coupled to be responsive to individual binary coded signals for "resetting" the latching element to signal the complementary binary state from the state signalled by the setting portion of the bistable element in response to a triggering signal coupled to either one of said input terminals. The resetting "logical" element is provided with an output terminal coupled thereto for signalling the aforementioned complementary binary state in accordance with the "logical" combination of the binary coded signals received at the input terminals thereof. The bistable latching element includes first circuit means coupled between the output of the setting "logical" element to provide an input signal to the resetting logical element to assure that the output signal of the resetting logical element switches to the complementary state when the setting logical element "set" Second circuit means is provided for the bistable latching element that is coupled between the output of the resetting "logical" element and providing an additional input signal for the setting "logical" element to assure that the output signal of the setting "logical" element switches to the complementary state when the resetting "logical" element is reset. The pair of input terminals for the setting "logical" element are maintained in a preselected binary state to cause the output signal at the corresponding output terminal to signal a preselected binary state so that upon reception of a setting signal at either one of the input terminals the output terminal will be switched to signal the complementary binary state in response thereto and the output terminal of the resetting "logical" element will also be switched to the complementary binary state to assure a latched output condition. The pair of input terminals for the resetting "logical" element is maintained in a preselected binary state to cause the output signals at the corresponding output terminal to signal the complement of the preselected binary state so that upon reception of a resetting signal at either one of said input terminals, the output terminal will be switched to signal the complementary binary state in response thereto and the output terminal of the setting "logical" element will be switched to the complementary binary state to assure a latched output condition. The "logical" elements for defining the binary bistable latching element may be constructed of conventional NAND logical elements or of NOR logical elements, or combinations thereof, or any other well known form of "logical" element.

The data latch of the aforementioned type is utilized to provide a method of digitally actuating a load to vary the potential applied to the load in preselected increments including the steps of providing a preselected plurality of binary latching elements of the aforementioned type with each latching element having a pair of "setting" input terminals and a pair of "resetting" input terminals, and a pair of "set" and "reset" output terminals for the complementary signalling of the binary state of the latch. The binary latching elements are arranged in a linear sequence with the setting output terminal for each latch coupled as a setting input signal for the next lower sequential latch to cause it to be set when the next higher latch is set and with the reset output terminal for each latch coupled as a resetting input signal for the next higher latch to cause it to be reset when the next lower latch is "reset". The method includes providing individual selection elements for individually applying a selection signal to the coupled latch or latches to change the state thereof, the latch elements are caused to respond to the operation of the selection element when one of the operated selection elements sets the coupled latch to a binary 1, it will cause all latches arranged at each of the lower sequential positions to be set to a binary 1, and when the operated selection element resets a coupled latch to a binary 0, all latches arranged at each of the higher sequential positions will be reset to a binary 0 whether the selection elements are operated in sequence or at random. The binary pattern derived from the output terminals of the latches varies between all binary 0's and all binary 1's and will increase or decrease by a binary 1 in progressing from one end of the sequence of latches to the other end in accordance with the direction traversed.

This method of digital operation can be utilized to control a load such as a lamp to sequentially energize or de-energize the load or lamp in response to the pattern of binary signals appearing on the output terminals whether the data latches are operated in sequence or at random.

These and other features of the present invention may be more fully appreciated when considered in the light of the following specification and drawings, in which:

FIG. 2 is a schematic circuit diagram of the basic "logical" circuit forms for defining the data latch for use in the latching system of FIG. 1;

Figure 1:
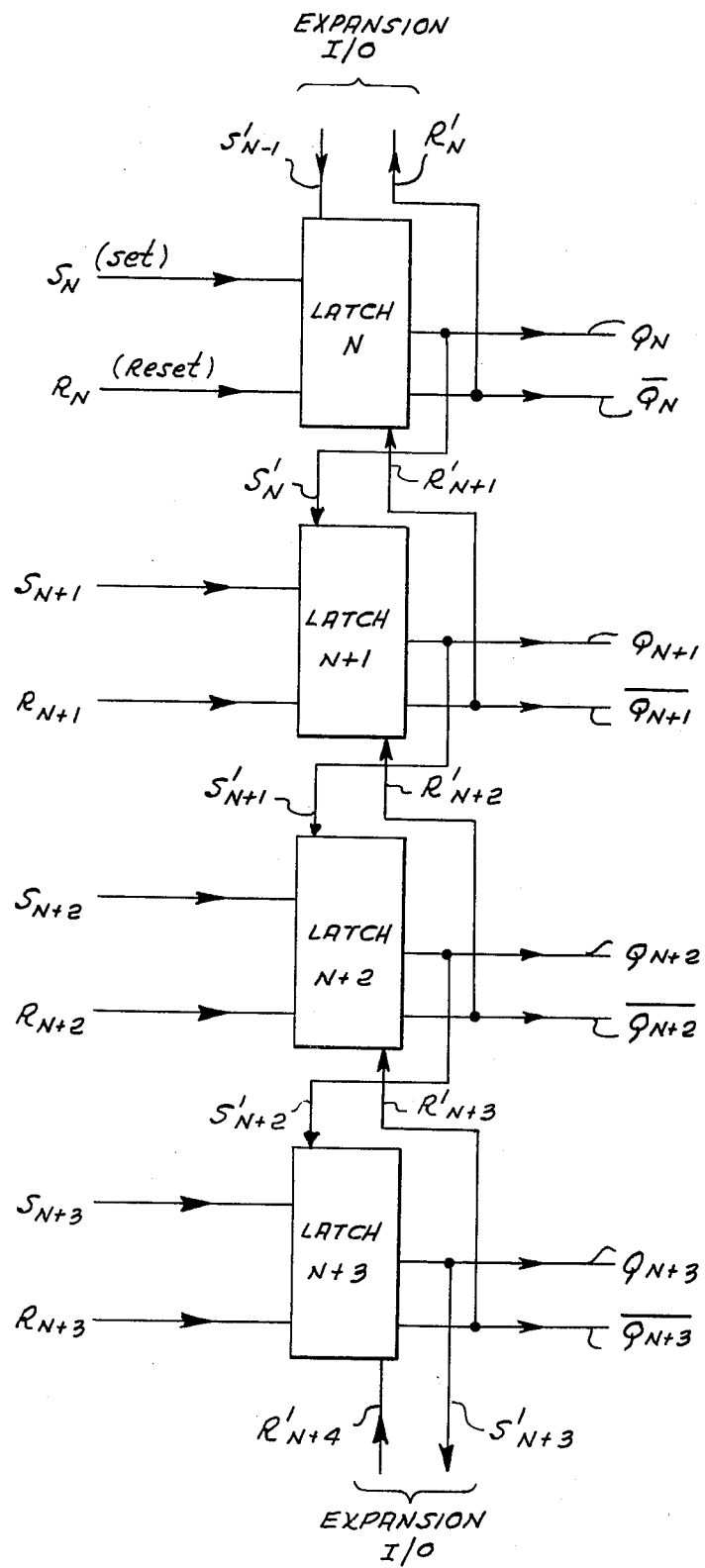
FIG. 1 is a generalized block diagram of the data latching system embodying the present invention.

Now referring to the drawings the invention will be described in detail. Referring to FIG. 1 in particular, the general concept of the electronic data latch will be initially examined. The arrangement illustrated in FIG. 1 comprises a series of latches that are identified as the latches n, n+1, n+2, n+3 . . . Each latch is provided with two set inputs and two resetting inputs along with two outputs. The latches n, n+1, etc. are controlled to provide an output pattern of binary bits that is always latched in a particular form. The output pattern derived from the series of latches will range between all binary 0's and all binary 1's, or a number of 0's and 1's in accordance with the number of latches employed. The data latch is constructed and defined so that if a particular latch is switched in response to a triggering signal coupled thereto, all the latches on one side of the selected latching element will be switched to a common output state, such as a binary 1, including the triggered latch, while all the latches on the opposite side of the triggered latch will remain in their prior state, such as the binary 0 state. This is true whether the latches are triggered in sequence or at random.

The latches each include two sensing inputs which correspond to the sensing inputs $S_n$ and $S'_{n-1}$ for the latch n, for example. The sensing input $S_n$ is defined to be responsive to an external triggering signal so that the output signal $Q_n$ will be switched to signal the corresponding binary state or voltage level. The setting signal $S'_{n-1}$ is transmitted from the adjacent latch (not illustrated) or the latch on the top side of the latch N as illustrated in FIG. 1 to transmit the setting signal from the corresponding $Q_{n-1}$ terminal. Similarly, the reset input, $R_n$, is constructed and defined to receive an external triggering signal to reset the latch n. Similarly, a resetting signal is transmitted from the adjacent latch, in this instance latch n+1, which is identified as the signal $R'_{n+1}$. The resetting of latch n in response to either one of these two resetting input signals will cause the outputs $R'_n$ and $\overline{Q}_n$ to be switched to the corresponding binary state. The latch n functions much in the fashion of a conventional flip-flop in that the two outputs $Q_n$ and $\overline{Q}_n$ cannot reside in the same state but will eventually assume complementary binary states. The complementary output signals, however, do not result from the mere setting and resetting signal applied to the latch, but the last input signal received at the latch after the signals are transmitted between latches will cause the outputs of each data latch to assume the complementary binary state. Accordingly, it should be noted that each latch n will use the input terminals $S_n$ and $R_n$ as sensing inputs and will use the inputs $S'_{n-1}$ and $R'_{n+1}$ to obtain the data transmitted from the adjacent latches to provide the desired operation.

An important feature of the data latch of the present invention is the arrangement for transmitting the data from adjacent latches to provide the desired output pattern in response to the triggering of a latching element. To this end each output signal from each latch n, n+1, etc. is transmitted to the adjacent latches. The S' signals are transmitted in one direction along the series of latches, while the R' signals are always transmitted in the opposite direction. This will be appreciated from examining the illustration in FIG. 1 wherein the $Q_n$, $Q_{n+1}$, $Q_{n+2}$ output signals are illustrated as being transmitted downwardly to latch n+1, n+2 etc., as the $S'_n$, $S'_{n+1}$, $S'_{n+2}$ signals to the respective latch. In the same fashion, the output of latch n+3, which is identified as $\overline{Q}_{n+3}$, is transmitted as a resetting input signal to latch n+2, and is identified as the $R'_{n+3}$ signal. Similarly, the resetting output $\overline{Q}_{n+2}$ of latch n+2 is transmitted upwardly from the output terminal to latch n+1 as the R' input signal $R'_{n+2}$. The same direction of transmission for the resetting output signals occurs for the latches n+1, n, etc. The result of this arrangement is that when a triggering signal is generated and is coupled to a setting input S for any one of the latches, the corresponding Q output and all of the corresponding Q outputs for the latches arranged in a lower position in FIG. 1 are set to the same voltage level or to signal a binary 1, for example. Similarly, when a triggering signal is coupled to a resetting, or R input of a latch, the corresponding Q output and all of the corresponding Q outputs for the latches arranged in a higher position are reset to the same voltage level, or a binary 0 state. This would cause a series of binary output signals from preselected Q output terminals to be always latched in the form such as . . . 000111 . . . so that this pattern will range from all 0's to all 1's and will yield one more unique output pattern than the number of latches in the series and having twice as many inputs as latches in the series. Stated differently, if all Q outputs are initially at 0, and if latch n+1, for example, is triggered at the $S_{n+1}$ terminal, the output $Q_{n+1}$ will be switched to the representative binary 1 state, irrespective to its previous output state and the latches n+2 and n+3 will also signal a binary 1 output, while latch n will remain latched in a binary 0 state at its selected output. If latch n is set at the $S_n$ terminal, it will cause all of the latches therebelow to signal a binary 1. Similarly, if the triggering signal is applied to the $R_{n+3}$ terminal of latch n+3, all latches above this position will be reset to signal a binary 0. The "logical" implementation of this concept is the basic concept disclosed herein and its application to various practical circuits will be examined hereinafter. The "logical" equations illustrated in FIG. 1 define the $Q_n$, $\overline{Q}_n$, $S'_n$ and $R'_n$ signals in terms of positive logic notation from the general concept standpoint. The symbol, +, is representative of the logical function "OR", the symbol, . , is representative of the logical function "AND", and the symbol, —, is representative of the function "NOT". In this notation, the S input is generally considered to set the corresponding Q output to represent a binary 1 and the R input to reset the same Q output to represent a binary 0. It should be noted that in the equations of FIG. 1 that Q and $\overline{Q}$ are treated as independent signals and their definitions can be interchanged.

It should be understood that, as illustrated in FIG. 1, any number of additional latches can be added above latch n and any number of additional latches can be added below latch n+3, or both.

Now referring to FIG. 2, a typical "logical" circuit that may be used for implementing the concept of the present invention will be described. The two basic latching elements illustrated in FIG. 2 are constructed in terms of conventional NAND and NOR circuits. It should be recognized that in addition to these basic circuits, a combination of NAND and NOR circuits can be utilized to define any one latching element, or any other conventional "logical" element may be utilized for this purpose in accordance with the concept of the present invention. Referring initially to the NAND implementation, it will be seen that two NAND elements are arranged to define a latch, each with three input terminals and a single output terminal. Each NAND element has a triggering input terminal for receiving an external setting or resetting signal and the top NAND element has its setting input terminal identified as the $\overline{S}_n$ terminal, while the other NAND circuit has its resetting input terminal identified as $\overline{R}_n$. In the initial condition of operation, it is assumed that a high voltage level signal, or a binary 1, will be applied to the two NAND circuits by means of the corresponding $\overline{S}_n$ and $\overline{R}_n$, as indicated in the drawing as the "sense" inputs. The $\overline{S}'_{n-1}$ signal is coupled to the upper NAND circuit as the signal that is transmitted from the next adjacent latch circuit (not illustrated) and is illustrated as transmitting a binary 1. The third input to the upper NAND circuit is the signal coupled from the $\overline{Q}_n$ output terminal of the lower NAND circuit and is illustrated as a binary 1. The output signal $Q_n$ from the upper NAND circuit and under the conditions described will signal a binary 0. Similarly, the output signal $Q_n$ will be coupled to the lower NAND gate as an input signal. The third input to the lower NAND gate is identified as the $\overline{R}'_{n+1}$ signal which is derived from the lower latch (not illustrated) and is illustrated as transmitting a binary 1. The output signal from the NAND gate in the lower portion of the illustration is identified as the $\overline{Q}_n$ and is indicated as signalling a binary 1, or the complement to the $Q_n$ output. The illustrated arrangement of the binary signals in FIG. 1 assumes an initial condition for the latch with the setting and resetting inputs $\overline{S}_n$ and $\overline{R}_n$ providing the high output level signals representative of binary 1's to the NAND gate. Accordingly, if a setting signal is applied at $\overline{S}_n$ this input signal will be switched to a low voltage level and therefore the input signal will be representative of a binary 0. This will momentarily cause the combination of input signals at the upper NAND gate to be changed from all 1's to include a 0 and therefore the output signal $Q_n$ will be switched to represent a binary 1. When the $Q_n$ output switches to a binary 1 state, this signal will be transmitted to the lower NAND gate and, accordingly, the input signals at this NAND gate will all signal a binary 1 so that in accordance with conventional NAND notation, the $\overline{Q}_n$ output will be switched to a 0 for signalling the binary complement of the $Q_n$ output. The binary 0 at the $\overline{Q}_n$ output is coupled to the upper NAND gate and latches it to signal a 1 at its output terminal after the triggering signal has terminated.

If the initial condition of the NAND latch as illustrated is again considered to exist, it should be noted that when a reset signal is applied to the $\overline{R}_n$ terminal, the switching of this signal from the binary 1 to the binary 0 voltage level will not effect the normal binary 1 output indication at the $\overline{Q}_n$ terminal based on the NAND logic. In order for the $\overline{Q}_n$ output signal to be complemented a change in the signal from the $Q_n$ terminal must be transmitted as a binary 1 along with the 1's at the resetting terminals to switch the output signal to a binary 0 at $\overline{Q}_n$.

The same arrangement prevails for the NOR implementation illustrated in the top portion of FIG. 2. In the NOR implementation, the sense inputs $S_n$ and $R_n$ normally provide a low level input signal, binary 0, as the setting and resetting inputs for the associated NOR gates. Similarly, the signal transmitted for the upper NOR gate identified as the $S'_{n-1}$ signal is indicated as a binary 0 with the $\overline{Q}_n$ output signalling a binary 1. The $Q_n$ output for the lower NOR latch is indicated as signalling a binary 0. The output signals from each of the NOR gates are cross-coupled as an input signal to the associated NOR gate, as illustrated. As indicated in FIG. 2, all of the input signals to the upper NOR gate signal a binary 0 so that the binary 1 is signalled from the $\overline{Q}_n$ output. Similarly, the input signals to the lower NOR gate are 100 in descending order, as illustrated, so that the $Q_n$ output signals a binary 0. As in the NAND implementation, the output signals from each of the gating elements are transmitted to the upper and lower latches in the manner illustrated in FIG. 1. In the same fashion as described for the NAND latch, when a "set" triggering signal is applied to the upper NOR gate, the input signal will be switched from a binary 0 to a binary 1 and, accordingly, in accordance with conventional NOR notation, the $\overline{Q}_n$ output will be switched to signal a binary 0 in response to the triggering signal. The signals are fed back so the $Q_n$ output goes to a binary 1 and the "set" NOR gate is latched to the 0 state in response thereto. Similarly, if the initial conditions are again assumed no change occurs at the output of the NOR latch in response to the resetting signal $R_n$ and will require the transmission of a binary 0 from the $\overline{Q}_n$ output to switch the $Q_n$ output to a binary 1 state.

Figure 3:
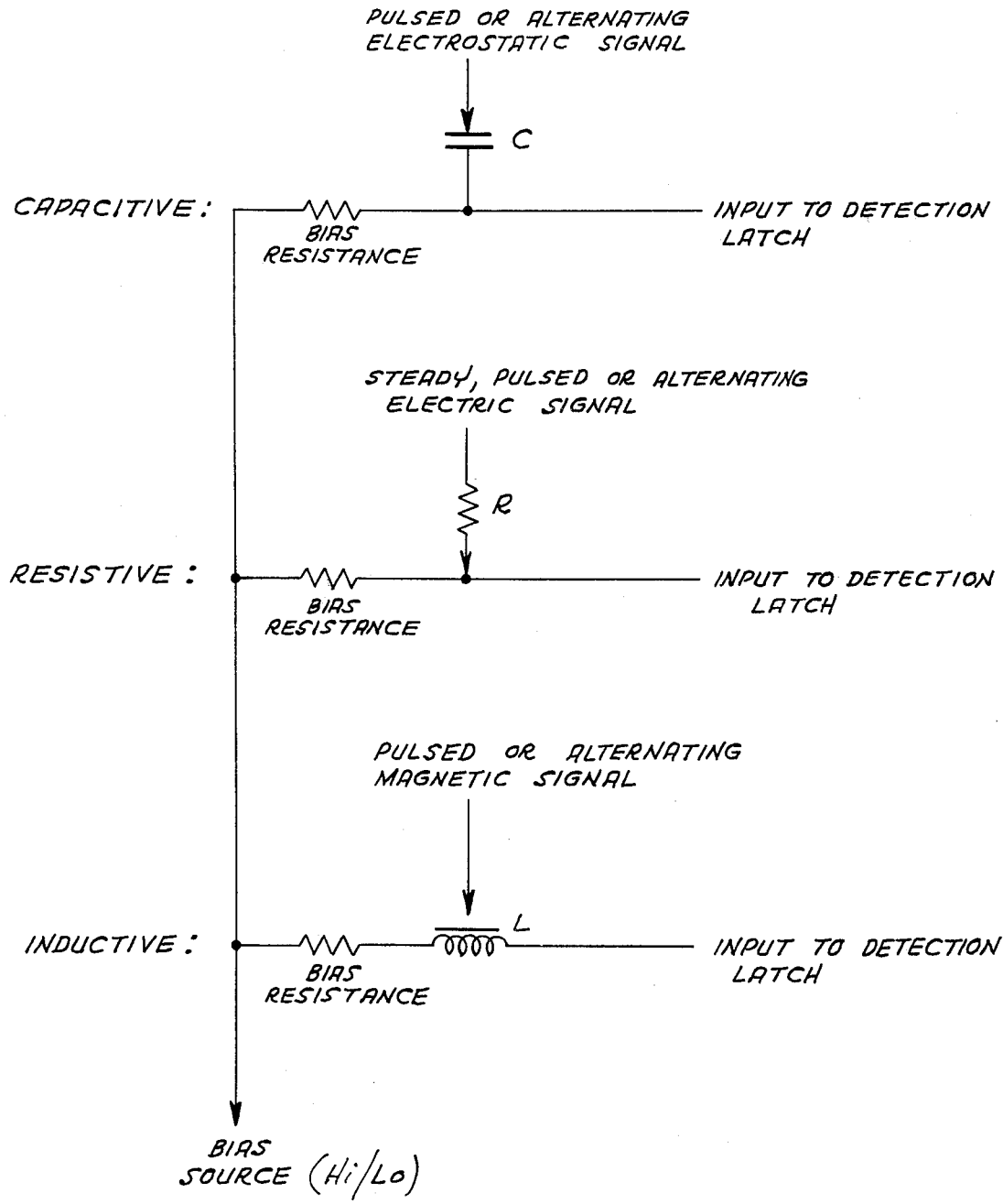
FIG. 3 is a schematic circuit diagram of different types of selection elements for triggering the data latches of FIGS. 1 and 2.

The setting and resetting signals for the "logical" latches described in FIGS. 1 and 2 are considered as external signals and are considered to be momentarily occurring triggering signals coupled to the respective latches. These signals can be produced by a number of different types of switching or selection elements. Typical input sensing forms are illustrated in FIG. 3. The input forms are diagrammatically illustrated in FIG. 3 as including a capacitive sensing element, a resistive sensing element, and an inductive sensing element. Any one of these may be utilized in accordance with the concept of the present invention and the sensing signals generated merely produce a momentary triggering signal of the opposite binary state from the steady state signal. The capacitive sensing arrangement diagrammatically illustrated merely shows a conventional touch sensitive element in the form of a capacitor. The bias resistance provides the steady state signal to the input terminal of the latch in accordance with the logic selected to implement the latch so it is either a normally high or a normally low signal, as described in conjunction with FIG. 2. In the capacitive type sensing element an individual will momentarily touch the sensing element selected and, through his body, a circuit will be completed so that the normal signal applied to a latch will be switched to its opposite or complementary binary state. In the manual operation of the touch sensitive capacitor selection element, an individual will momentarily touch one plate of the capacitor and thereby generate the triggering signal to the latch. The same general operation is true for the resistive and inductive signals wherein a normal steady state signal is provided to the latch to signal one binary state and the operation of a selected element will momentarily provide a triggering signal of the opposite level to the latch. It will also be appreciated that the necessary triggering signals can be provided optically as well. The practical implementation of the present invention will be described as the triggering signals may be derived in response to the operation of the touch sensitive capacitor, as illustrated in FIG. 3.

Figure 4:
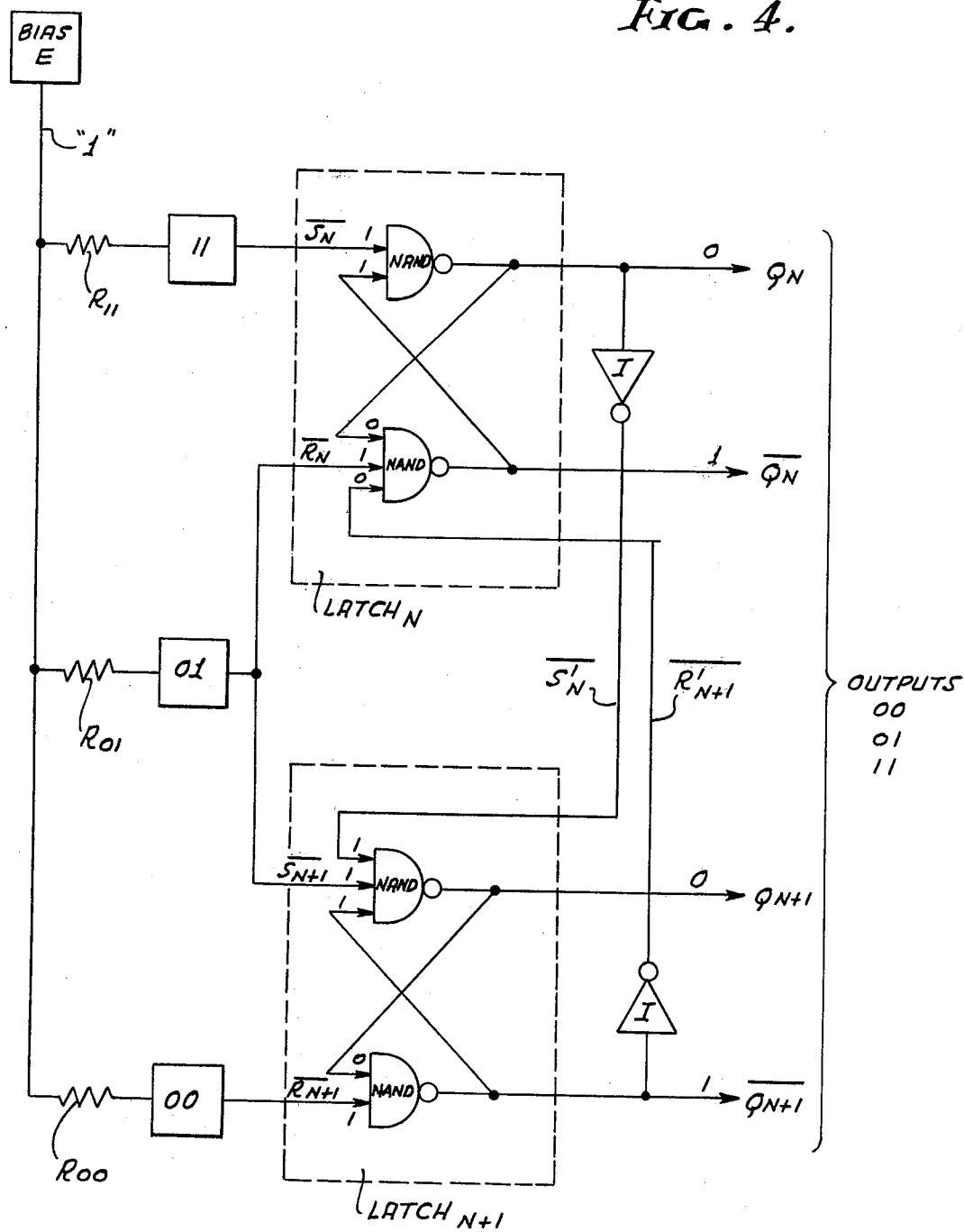
FIG. 4 is a schematic circuit diagram of the two stage data latch constructed of NAND "logical" elements.

Now referring to FIG. 4, wherein a simplified arrangement of the data latches is illustrated wherein only two latches are employed along with three touch sensitive selection elements as providing the input signals to the two data latches and to provide one of three binary output patterns, 00, 01, or 11. The latches are illustrated in FIG. 4 as the latch n and the latch n+1. Each latch is constructed in terms of NAND elements as described in conjunction with FIG. 2. The latch n has its lower NAND gate provided with three input terminals and the upper NAND gate with two input terminals. The third input signal illustrated in FIG. 2 is omitted from the upper NAND gate for latch n since in the two-stage implementation there will be no signal transmitted from an upper level latch. Similarly, latch n+1 is arranged with the upper latch having three input signals and the lower latch having two input signals. The input signal transmitted from the lower latch, or the n+2 latch, for example, is not required in this two-stage latch implementation. Each of the selected elements for coupling the setting and resetting signals to the latches n and n+1 are considered to be capacitive elements or touch sensitive elements. The elements are identified as the elements 00, 01, and 11, reading from the bottom to the top and correspond to the output signals that will be generated at the output of the latches when the individual element is selected. These selection elements are each coupled to high voltage level source E by means of the individual bias resistors identified as the resistors $R_{00}$, $R_{01}$ and $R_{11}$ coupled between the bias voltage source and the individual selection elements 00, 01 and 11, respectively. The selection element 00 is connected directly to the reset terminal R of the lower NAND gate for latch n+1. The selection element 01 is connected as the setting input S to the setting input terminal for the upper NAND gate of latch n+1 and simultaneously to the resetting input terminal R for the lower NAND gate of latch n. Selection element 11 is connected as the setting input signal S for the upper NAND gate of latch n. The individual NAND gates of latches n and n+1 are cross-coupled between the output and input as described in conjunction with FIG. 2. It should be noted that the signals transmitted between latches in this instance include an inverter circuit I to provide the proper polarity for proper operation of the latching elements. Accordingly, the output signal appearing on the $Q_n$ terminal for latch n is coupled by means of an inverter I as an input signal to the upper NAND gate of latch n+1. Similarly, the output signal appearing at the output terminal $\overline{Q}_{n+1}$ is coupled by means of an inverter I as an input signal for the lower NAND gate for latch n. The output binary pattern of signals that is generated from the two-stage latching arrangement of FIG. 4 is considered as being derived from the $Q_n$ output from latch n and the $Q_{n+1}$ output from latch n+1. The signals indicated in FIG. 4 are the signals that will prevail when the two-stage latching arrangement signals the binary output 00.

It should now be appreciated that if the selection element 00 is operated while the output pattern is 00, no change will be produced since the changing of the R signal from a binary 1 to a binary 0 at the latch n+1 resetting input will not cause any change in accordance with basic NAND terminology. Under these same conditions, when the output pattern signalled is 00, and the selection element 01 is operated, then the input signals to latches n and n+1 in response to this operation will be changed.

When the 01 selection element is operated, the upper NAND gate for the latch n+1 will set the output $O_{n+1}$ to a binary 1 state. At the same time, the reset signal to the lower NAND gate for latch n has been switched to a binary 0 but the latch n is already reset and so the $\overline{Q}_n$ output terminal will still signal a binary 1. The output pattern then will signal 01 corresponding to the outputs at the $Q_n$ and the $Q_{n+1}$ terminals, respectively. When the 11 selection element is operated, the output signal of the upper NAND gate for latch n will be switched and the latch will be set so that the $Q_n$ output terminal will now signal a binary 1. This is in accordance with the previous discussion wherein the receipt of a "set" signal to a NAND gate will set the output accordingly. The 1 at the output $Q_n$ will be transmitted to the lower NAND gate of latch n by the cross-coupling connection. Similarly, the inverted $Q_n$ output will be applied as a binary 0 to the upper NAND gate for latch n+1. This will cause the output $\overline{Q}_{n+1}$ to be switched or set to a binary 1 state. When this output terminal is switched, the binary 1 is coupled to the lower NAND gate for latch n+1 so that the $Q_{n+1}$ output will be switched to a binary 0. This binary 0 will be transmitted as an input signal to the upper NAND gate for latch n+1 to latch the $Q_{n+1}$ output. The latched binary 0 at the $\overline{Q}_{n+1}$ terminal is inverted and transmitted as a binary 1 to the lower NAND gate for latch n and thereby latching its output to a binary 0. The $\overline{Q}_n$ output for latch n will be latched to the 0 binary state. This results from all 1's appearing at the NAND gate from the $Q_n$ and inverted $\overline{Q}_{n+1}$ terminals. Accordingly, it will be noted that the output patterns generated will be in accordance with the identification of the selection elements 00, 01, 11, whether the elements are operated in sequence, as described hereinabove, or in random order.

Figure 5:
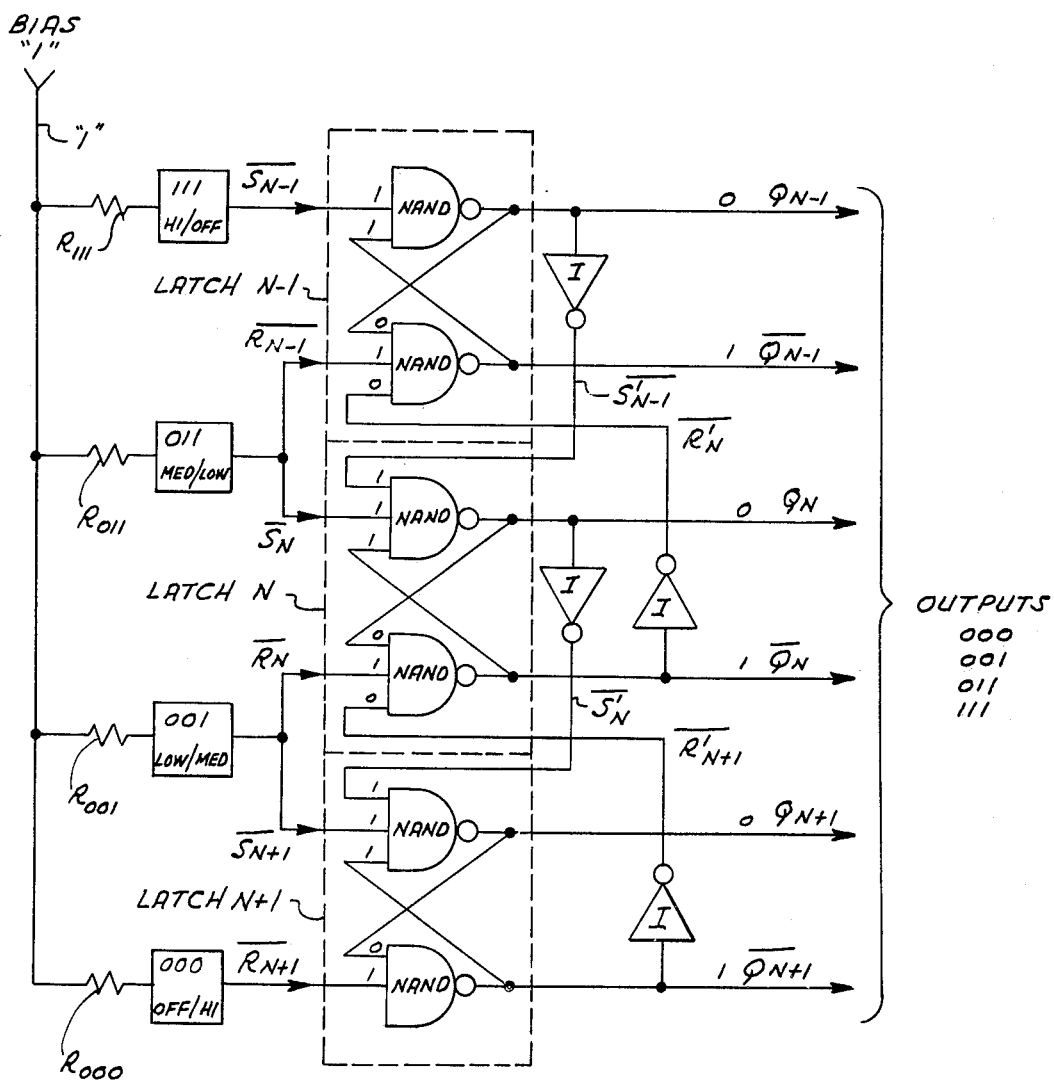
FIG. 5 is a schematic circuit diagram of a three stage embodiment of the data latch of the present invention.

Now referring to FIG. 5, the concept of the invention will be described as it may be implemented in terms of three data latches wherein each of the data latches is constructed of NAND "logical" elements. In this embodiment the transmission of the signals between latches for providing the desired output pattern is made more evident because of the fact that there are a larger number of latching elements. The latching elements are identified as the latches n−1, n, and n+1, reading from the top to the bottom, as illustrated in FIG. 5. The selection elements are identified in accordance with the notation of FIG. 4 to indicate the output pattern that is generated when the particular selection elements are operated. The outputs provided in this instance are four outputs having three binary bits therein and range from all 0's, 001, 011, to all 1's, as illustrated in FIG. 5. The arrangement is basically the same as that described in conjunction with FIG. 4 except for the additional inputs provided as a result of transmitting each of the output signals from latch n to each of the adjacent latches n−1 and n+1. As in FIG. 4, the binary states that are illustrated correspond to the binary state when the output signals 000 are signals at the outputs $Q_{n-1}$, $Q_n$, and $Q_{n+1}$. All of the signalled outputs are derived from these three output terminals. The selector elements 000, 001, etc. are each coupled to the bias source, shown as bias "1" source, and are coupled thereto through individual resistors, which are identified as the resistors $R_{000}$, $R_{001}$, $R_{011}$ and $R_{111}$, respectively as shown in the drawings.

TABLE I

LATCHED CONDITIONS
(all $\overline{R}$ and $\overline{S}$ = "1")

| latch code | logic levels | | | | | |
|---|---|---|---|---|---|---|
| | $Q_{N-1}$ | $Q_N$ | $Q_{N+1}$ | $\overline{Q}_{N-1}$ | $\overline{Q}_N$ | $\overline{Q}_{N+1}$ |
| 000-off | 0 | 0 | 0 | 1 | 1 | 1 |
| 001-low | 0 | 0 | 1 | 1 | 1 | 0 |
| 011-med | 0 | 1 | 1 | 1 | 0 | 0 |
| 111-high | 1 | 1 | 1 | 0 | 0 | 0 |

TABLE II

SYSTEM TRANSITIONS
active input/resulting latch code

| sense input | previous latch code | | | |
|---|---|---|---|---|
| | 000-off | 001-low | 011-med | 111-high |
| 000-off | NC | $\overline{R}_{N+1}/000$ | $\overline{R}_{N+1}/000$ | $\overline{R}_{N+1}/000$ |
| 001-low | $\overline{S}_{N+1}/001$ | NC | $\overline{R}_N/001$ | $\overline{R}_N/001$ |
| 011-med | $\overline{S}_N/011$ | $\overline{S}_N/011$ | NC | $\overline{R}_{N-1}/011$ |
| 111-high | $\overline{S}_{N-1}/111$ | $\overline{S}_{N-1}/111$ | $\overline{S}_{N-1}/111$ | NC |

The basic operation of the three latch arrangement of FIG. 5 is the same as that described in conjunction with FIG. 4 and is represented in Table I hereinabove in the static condition of the latch only. In summary, the output pattern generated will correspond to the identification of the selector elements 000, 001, etc. The latch code column of Table I is the corresponding output pattern as represented in Table I and the output patterns are identified in terms of the output terminal of the three latches that will produce the three binary bits for producing the series of output patterns ranging from all 0's to all 1's. Along with this, the complementary output terminals for each of the latches are identified in Table I with their binary signal represented so that it can be determined that they are the complement, in each instance, to the final latched state providing the latch code for the three latches.

Table II relates all of the output pattern or latch codes in which the output terminals may be residing at a time when any one of the three selector elements could be operated. Accordingly, when the 000 selection element is operated, for example, and the output pattern or previous latch code existing at that time is all 0's, it will be seen by the representation "NC" in the column opposite the sense input 000 that the letters NC indicate "No Change". If, however, the output pattern or previous latch code is 001, when the 000 selection element is operated it will be seen that the $\overline{R}_{n+1}$ input will be switched or operative and the output pattern will be switched to 000 from 001. Similarly, if the output pattern is 011 at the time of the operation of the 000 selection element, the $\overline{R}_{n+1}$ element will be operative so as to switch the $\overline{Q}_{n+1}$ output terminal and the $\overline{Q}_n$ output terminals to 1, resulting in all Q outputs going to 0. The same operation can be traced when all 1's are signalled and the 000 selection element is operated to return the output pattern to all 0's. The same operation can be traced through with the aid of Table II for each of the other three selection elements to determine which signals are active to place the output pattern in the pattern represented by the selection element operated. In each instance in Table II, the active input terminal to the latching network is identified along with the output pattern that is generated or no change is indicated by the letters "NC".

In following through all of these conditions, it will be noted that whenever a selection element is operated, all those latches above the selected or operated element will be set to signal a binary 0, while those below will be set to the binary 1. In the case of the selection element 111, all outputs below it will be set to a binary 1, while the operation of the selection element 000 will reset all of the elements to signal 000. It should also be noted that in both Tables I and II the latch codes are also identified as off, low, medium, high. This notation corresponds to the control provided when the control network is utilized to control the energization and de-energization of a load or lamp, as will become evident hereinafter.

Figure 6:
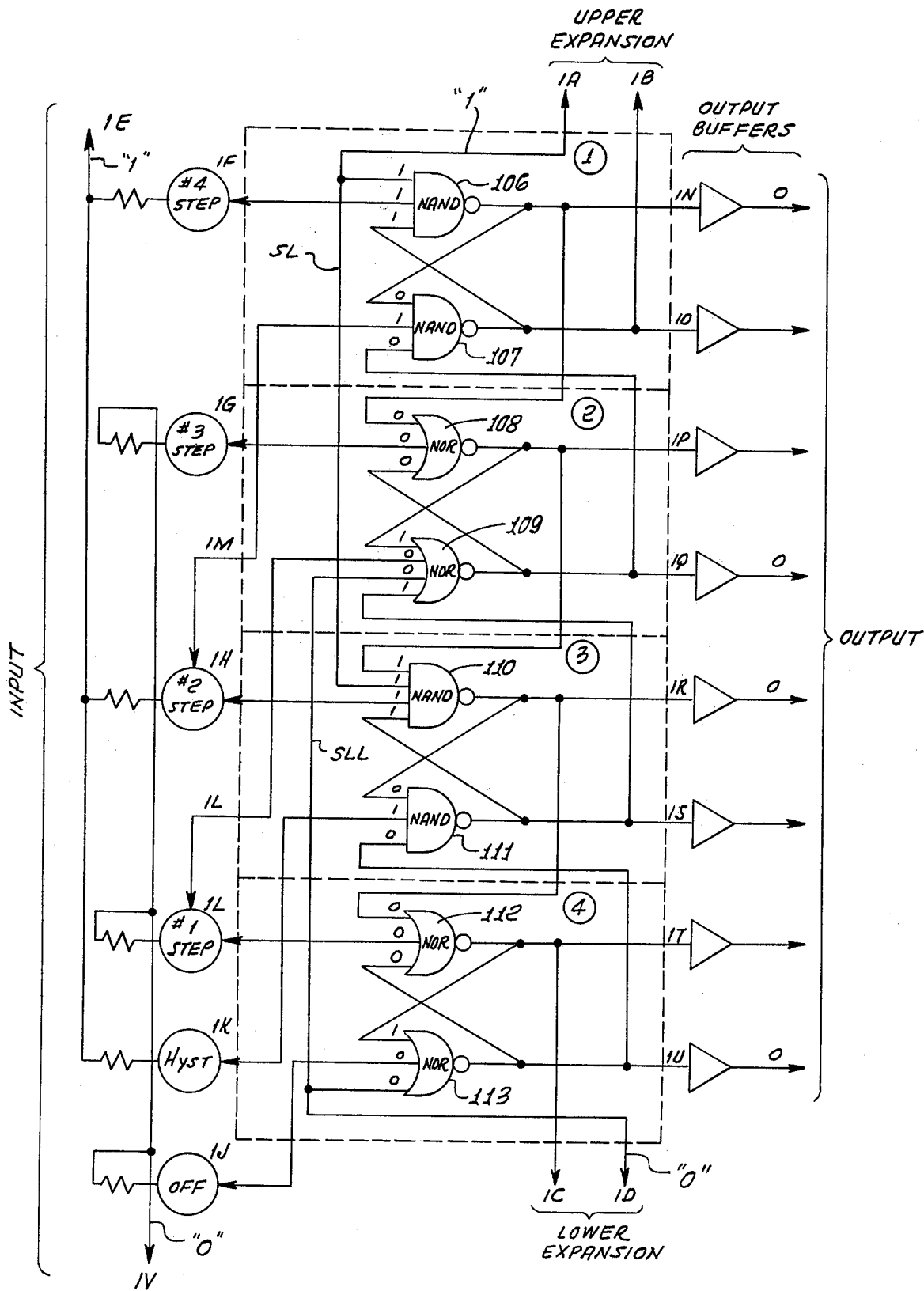
FIG. 6 is a schematic circuit diagram of a NAND/NOR implementation of the data latching system including hysteresis for the selection elements.

Now referring to FIG. 6 wherein four latching stages are illustrated and are constructed of NAND and NOR "logical" elements. This arrangement of NAND/NOR logical elements takes advantage of the complementary nature of these logical gates to provide the desired output signals without requiring the use of inverters in transmitting the signals from stage to stage, as described hereinabove. When the latching arrangement of the present invention is utilized for controlling the light output generated by a lamp, and the selection elements are closely spaced together, the circuit arrangement in FIG. 6 includes a hysteresis effect so that if two selection elements are actuated at the same time there will be no conflict in the output state. The hysteresis can generally vary from 0 to 1 less than the number of latching elements in the series. The circuit arrangement of FIG. 6 also includes speed-up links to increase the speed with which the latches respond to signals without having any effect on the ultimate latched output code.

In the circuit arrangement of FIG. 6, the selection elements are arranged in accordance with their function and are so identified. The bottom selection element is identified as the "Off" element, while the next higher element is identified as the hysteresis element. The third selection element from the bottom of the drawing is identified as the 190 1 step with the subsequent elements identified as steps #2, #3 and #4. In view of the use of complementary NAND and NOR logical elements, the signals that are normally applied as a bias voltage to the selection elements must be alternated. The setting input signal to Latch #1, the topmost latch, will be a binary 0, in view of the fact that the step #4 selection element is coupled to the high voltage source 1E along with selection element step #2, and the hysteresis element. These input signals are further identified as the 1F, 1M, 1H, and 1K inputs. The remaining selection elements are connected to a low level voltage source 1V so that a binary 0 is coupled to the corresponding terminals. These selection elements are the "Off", #1 step, and the #3 step selection elements, which also are identified in terms of their input signals as 1J, 1I, 1L and 1G, respectively. The remaining circuitry is basically the same as that previously described, with the exception that every other latching element is defined by the complementary logical gating elements. The "logical" gating elements comprising the four latches reading from the top to the bottom as viewed in FIG. 6 are further identified by the reference numerals 106, 107, 108, 109, 110, 111, 112 and 113. The output terminals from each latch are also further identified as the terminals 1N, 1O, 1P, 1Q, 1R, 1S, 1T and 1U, also reading from the top to the bottom as illustrated in FIG. 6. These output terminals provide the output signals that provide the output pattern of binary signals desired from the latching network. The desired binary output pattern is derived from the output terminals 1N, 1Q, 1R and 1U. Output buffer amplifiers are illustrated between the output terminals of the gating elements and the input to utilization circuitry. The buffers may be eliminated in certain applications. In addition, one of the speed-up links that is illustrated is identified as the link SL in FIG. 6. The speed-up link SL is illustrated as coupled between the input terminal 1A and the input to the logical element 110. Another speed-up link SLL is coupled from the input terminal 1D to the input of logical gating element 109. In the arrangement of the logical elements described hereinbefore, the signals will ripple through the adjacent stages in response to reception of the signal transmitted from the upper or lower level latches. For example, the signal appearing at the point 1A will provide the triggering function to NAND gate 106. However, in order to take advantage of the signal changes at point 1A, this signal must be rippled through the logical gating elements 106, 108, 110 and 112 before it can reach point 1C to trigger any lower latches and will require a finite amount of time which, in a large system would make the response time too long to be practical. Accordingly, the speed-up link SL coupled from the point 1A to the gate 110 aids in overcoming this problem by eliminating the ripple delay period due to gate 106 and gate 108. This has been determined to increase the response time by a factor of two for this configuration. Similarly, the speed-up link SLL transmits a signal in the opposite direction and is coupled between input terminal 1D and the input to logical gate 109.

The output code 0000 can be illustrated to be a stable initial condition by tracing the signal through the series as follows: a binary 0 at output terminal 1U causes the NAND gating element 111 to apply a binary 1 to its output terminal 1S. This binary 1 signal then causes the NOR gating element 109 to apply a binary 0 at output terminal 1Q for the NOR gate 109. This binary 0 output signal will force the logical NAND gate 107 to signal a binary 1 at its output terminal 1O. The output signal at terminal 1O will be combined with the binary 1 from point 1A and the bias signal 1F at the NAND gate 106 to produce a 0 output at output terminal 1N. This binary 0 output signal is transmitted as an input signal to gate 108 where it is combined with the input bias signal 1G, and the 0 output signal from terminal 1Q to cause a binary 1 to be signalled at the output terminal 1P. This latter output signal is combined with the binary 1's provided by inputs 1A, 1H and 1S at the input to the NAND gate 110 to produce a binary 0 on its output terminal 1R. In turn, the 0 output signal on terminal 1R will be combined with the binary 0's from inputs 1I and 1U at the NOR gate 112 to produce a binary 1 at output terminal 1T. The binary 1 output signal at terminal 1T will cause the NOR gate 113 to signal a binary 0 at output terminal 1U. The logical trace was initiated at terminal 1U and confirms that a stable latched condition results. When such a latching network is utilized for controlling the energy to the lamp, the output code of 0000 could correspond to the light being off. It should also be noted that this initial condition will always prevail when the "Off" selection element is operated, since this will force the NOR gate 113 to signal a 0 at its output terminal 1U and cause all of the corresponding outputs to go to 0, as traced through hereinabove.

Proceeding to the hysteresis selection element, hyst., and assuming the output pattern is 0000, if this selection element is operated a "0" is applied to the input of NAND gate 111 to cause a binary 1 to appear at terminal 1S. Since terminal 1S is already at "1", the operation of the hysteresis selection element will have no effect on the latches and the output code will remain at 0,0,0,0. This is the function of the hysteresis effect which resists code changes when adjacent selection elements are activated. In the circuit diagram of FIG. 6 the hysteresis is 1, which is considered to mean that the trigger signal can be moved back one selection element from wherever it was without causing a change in the output pattern. In the general case the number of hysteresis elements can vary from zero to one less than the number of latching stages.

Continuing to trace the "logical" operation, the next step is the operation of #1 step element. When this selection element is operated the logic will take its first step. The binary 1 from the 1L would cause NOR gate 109 to signal a "0" at output terminal 1Q so no change will occur there. The binary 1 from line 1I to NOR gate 112 will cause a 0 signal at terminal 1T, which will combine with the "0's" from lines 1J and 1D at NOR gate 113 to produce a "1" on output terminal 1U. The signal at 1U is coupled to the input of NOR gate 112 to provide a latched condition at latch 4. The change in signal at terminal 1U will not affect the upper three latches because the "0" already present at the output terminal 1R will force NAND gate 111 to continue to signal a "1" since it was latched in its previous state. The resulting output pattern at terminals 1N, 1Q, 1R and 1U becomes 0,0,0,1, respectively. If now the hysteresis element is operated it will have no effect on the output signals since it is only capable of resetting the upper three latches to "0", which is already the case. If the operation of the selection elements is back to the OFF element, it would reset the latch No. 4 as described hereinabove and result in the output 0,0,0,0.

Continuing the operation of the selection elements upwardly and operating the #2 step element under the assumed output conditions of 0000 the change in the signal on line 1M will not cause any change since it will try to reset the upper latch, which is already at "0". The signal on line 1H, however, will force NAND gate 110 to switch to a "1" at terminal 1R. With the change in signal at output terminal 1R, it will be transmitted to the input of NOR gate 112 to cause a change at its output terminal 1T to signal a binary 0. The change to a 0 at 1T will be combined with the signals on lines 1D and 1J at the input of NOR gate 113 to now signal a 1 at terminal 1U. The binary 1 at terminal 1U is also transmitted to the input of NAND gate 111 to cause a binary 0 to be signalled at its output terminal 1S. The change in binary level at terminal 1S is coupled to NAND gate 110 to latch the output terminal 1R to the "1" state. The latches 1 and 2 are not changed in their output pattern since the change in the output signal at terminal 1S is not effective at NAND gate 109 due to the presence of the "1" from the terminal 1P to maintain the output terminal 1Q at 0. The resulting output pattern is 0011. Again, moving back down the selection elements one step would have no effect on the output pattern since the #1 step element is only capable of resetting the upper latches 1 and 2 to "0" and setting the bottom latch 4 to "1". Since these latches presently signal these outputs, the output would remain at 0,0,1,1. If the selection is moved back down to the hysteresis element the third latch will be reset by the signal on line 1K, returning the output pattern to 0,0,0,1. If the selection is moved back down to the OFF element all of the latches will be reset to "0".

This procedure can be traced for operating the remaining selection elements #3 step and #4 step to generate the output patterns 0111 and 1111, respectively.

TABLE III

| stable outputs 1N,1Q,1R,1U | LATCHED CONDITIONS logic levels | | | | | | | | | | | | | | | | | | | | | inverted outputs 1O,1P,1S,1T |
|---|---|---|---|---|---|---|---|---|---|---|---|---|---|---|---|---|---|---|---|---|---|---|
| | expand | | | | sense inputs | | | | | | | | | outputs | | | | | | | | |
| | A | B | C | D | E | F | G | H | I | J | K | L | M | N | O | P | Q | R | S | T | U | V | |
| 0000 | 1 | 1 | 1 | 0 | 1 | 1 | 0 | 1 | 0 | 0 | 1 | 0 | 1 | 0 | 1 | 1 | 0 | 0 | 1 | 1 | 0 | 0 | 1111 |
| 0001 | 1 | 1 | 0 | 0 | 1 | 1 | 0 | 1 | 0 | 0 | 1 | 0 | 1 | 0 | 1 | 1 | 0 | 0 | 1 | 0 | 1 | 0 | 1110 |
| 0011 | 1 | 1 | 0 | 0 | 1 | 1 | 0 | 1 | 0 | 0 | 1 | 0 | 1 | 0 | 1 | 1 | 0 | 1 | 0 | 0 | 1 | 0 | 1100 |
| 0111 | 1 | 1 | 0 | 0 | 1 | 1 | 0 | 1 | 0 | 0 | 1 | 0 | 1 | 0 | 1 | 1 | 0 | 1 | 1 | 0 | 0 | 1 | 0 | 1000 |
| 1111 | 1 | 0 | 0 | 0 | 1 | 1 | 0 | 1 | 0 | 0 | 1 | 0 | 1 | 1 | 0 | 0 | 1 | 1 | 0 | 0 | 1 | 0 | 0000 |

Table III relates the five stable output patterns generated by the arrangement of FIG. 6 under static conditions only. The bias voltage 1E and 1V are also represented along with values for the expansion signals at 1A, 1B, 1C and 1D. All of the signals at each of the output terminals are also recorded in as they appear in sequence and the inverted or complementary form of the desired, stable output pattern.

TABLE IV

| previous outputs 1N,1Q,1R,1U | SYSTEM TRANSITIONS* active input/resulting output codes SELECTION ELEMENT | | | | | |
|---|---|---|---|---|---|---|
| | #4 | #3 | #2 | #1 | HYST | OFF |
| 0000 | F/1111 | G/0111 | H/0011 | I/0001 | *SAME* | SAME* |
| 0001 | F/1111 | G/0111 | H/0011 | *SAME* | *SAME* | J/0000 |
| 0011 | F/1111 | G/0111 | *SAME* | *SAME* | K/0001 | J/0000 |
| 0111 | F/1111 | *SAME* | *SAME* | L/0011 | K/0001 | J/0000 |
| 1111 | SAME | *SAME* | M/0111 | L/0011 | K/0001 | J/0000 |

*Areas marked "*SAME*" show the effect of hysteresis

Table IV is generally similar to Table III in relating the circuit arrangement of FIG. 6 to the desired pattern. In Table IV the operation of a selection element is identified along with the state of the output pattern that exists at the time a selection element is operated to identify the resulting output pattern generated under the selection element column along with the active signal line. All possible initial states are represented in this Table IV. Where "same" is recorded, no change in the output pattern results due to the provision of the hysteresis.

In all this, it is important to note that the selection elements need not be operated in sequential fashion to produce a desired binary output pattern, but the latching arrangement allows selection elements to be operated at random to produce a desired output. This is true, since all the latches below a "set" latch will be set to a binary 1, and when any latch is "reset" to a binary 0, it will cause all latches above it to be also reset to a binary 0. This will allow a load such as a lamp that is controlled by means of such a latching arrangement to jump from one brightness level to another by operation of the appropriate selection element.

Now referring to FIG. 7, the data latch of the present invention will be described as it may be directly employed for controlling the light output of a lamp L. It will be recognized that the binary output pattern provided by the twelve latches illustrated in FIG. 7 permit the output pattern to be converted to a corresponding analog signal for energizing the lamp L therewith. For this purpose, the twelve latching elements are identified as the elements L1 through L12 reading from the top to the bottom as illustrated. As it will be noted, the latching elements are constructed of a combination of NOR and NAND circuits, with the odd number latching elements, L1 etc., being constructed of NOR elements, and the even numbered latches, L2 etc., being constructed of NAND elements. The selector elements for controlling the latching elements to energize the lamp L and to de-energize the lamp are identified as the elements $P_1$ through $P_{16}$. The selection element $P_{16}$ is effective for completely de-energizing the lamp L, while the operation of the selection element $P_1$ in conjunction with latch L1 will fully energize the lamp. The intermediate light levels between the fully "On" and the fully "Off" conditions are provided in increasing light intensity by the selector elements as the numbers decrease from $P_{15}$ to the selection element $P_2$. The output terminals for the latches L1 through L12, which provide the desired latch code output, are the outputs identified as $Q_1$, $Q_2$, $Q_3$ through $Q_{12}$. Each output pattern is identified in Table V comprising thirteen different output patterns that are identified under the column "Latch Code" in Table V as the codes 1–12. The binary state for each output $Q_1$–$Q_{12}$ is identified for each latch code. The right hand portion of Table V, beginning with column $\overline{Q}_1$ through $\overline{Q}_{12}$ merely indicates the complementary states of the corresponding latch code outputs for each of the latch elements. The operation of selection element $P_{16}$ defines all zero outputs, while latch code 12, which is all 1's, corresponds to the operation of selection element $P_1$. Due to the hysteresis effect built into the system of FIG. 7 there are less output code patterns than there are selection elements illustrated.

For the purposes of providing an analog signal for energizing the lamp L a digital-to-analog converter is provided. To this end, each of the latches L1 through L12 is provided with an output resistor arranged in series with the signalling output terminal for signalling the desired output binary bit. Each of these resistors is connected to the appropriate Q output terminal and a control bus identified as $V_{control}$. The resistors for the latches L1–L12 are identified as the resistors $R_1$ through $R_{12}$, respectively. The output circuits for the latches L1–L12 are also provided with indicator lamps. The indicator lamps are identified as the lamps $I_0$ through $I_{12}$ for the respective latch codes 12–0. The illuminated lamp $I_0$–$I_{12}$ corresponding to the latch code is identified in Table V.

Figure 7:
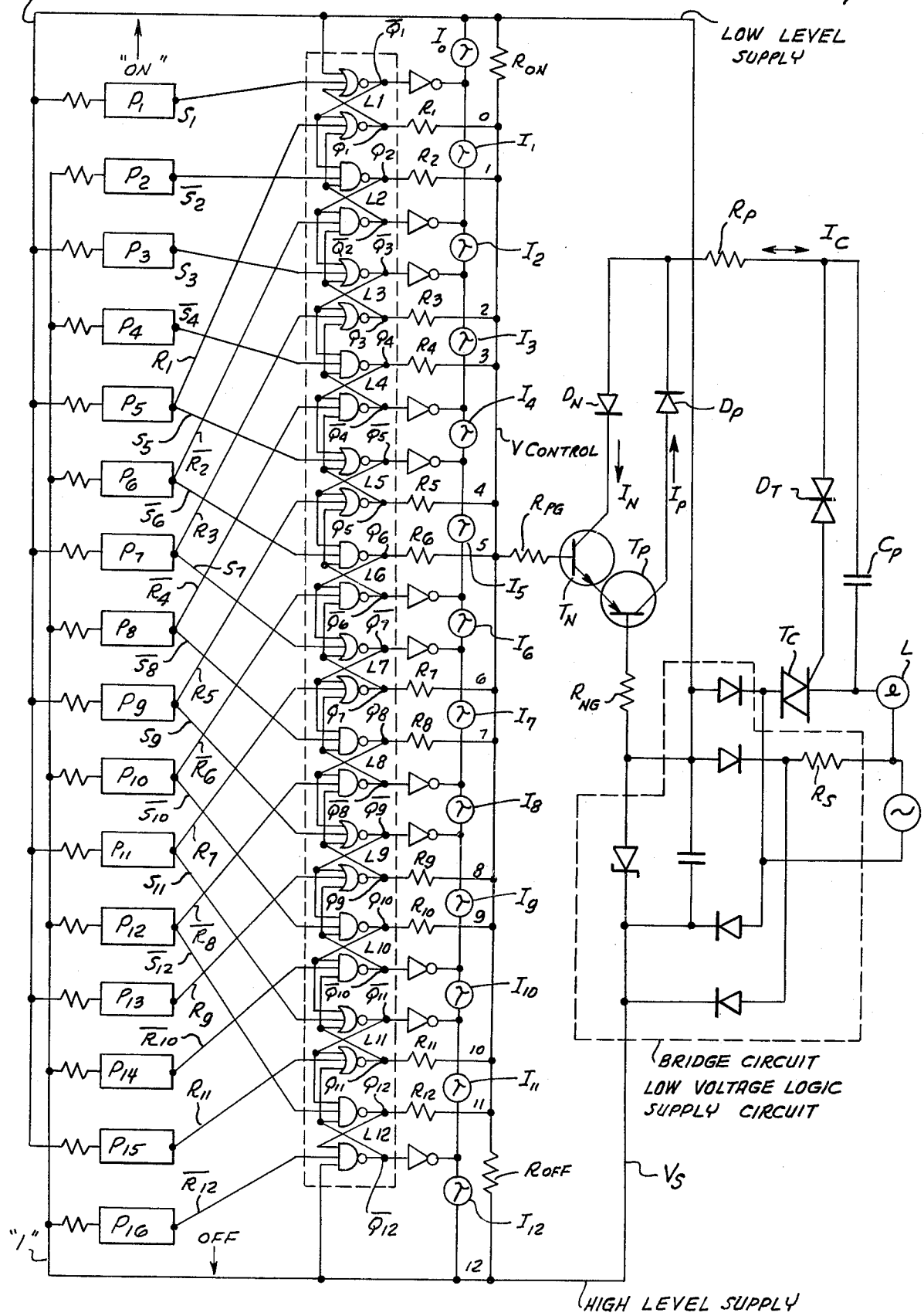
FIG. 7 is a schematic circuit diagram of a data latching system arranged with an analog control network responsive to the data latches for controlling the energization and de-energization of a lamp.

The system of FIG. 7 is powered from a conventional alternating current source which is, in turn, connected to a bridge rectifying circuit for supplying the voltage levels to the latching logical elements and the digital-to-analog converter. The high output level from the bridge circuit is identified as a $V_s$ line. The power control network arranged between the output of the latches L1–L12 and the power supply is basically defined to control the rate at which the capacitor $C_p$ charges and thereby control the power applied to the lamp L and the light output. As the rate of charging the capacitor $C_p$ increases more power is expended by the lamp so that the lamp will go from fully off, to dim, to bright, in accordance with these charging rates. The longer time that is required to charge the capacitor $C_p$, the less power is applied to the lamp and the dimmer the light output. For this purpose a voltage to bidirectional current converter is defined and is coupled between the low level supply line and the control line $V_{control}$ and comprises a positive gain resistor $R_{pg}$ and transistor $T_P$ and a negative gain resistor $R_{ng}$ and transistor $T_N$. The collector electrode of the transistor $T_P$ is connected by means of a diode $D_P$ to a terminal of the capacitor $C_P$ through resistor $R_P$. Similarly, a diode $D_N$ is connected from the collector electrode of the transistor $T_N$ to the same terminal of the capacitor through resistor $R_P$. The capacitor $C_P$ is connected with one plate connected in common with the triac $T_C$ and the lamp L and the other plate connected to the junction between the diodes $D_N$ and $D_P$ and through the resistor $R_P$. From the junction between the resistor $R_p$ and the capacitor $C_P$ there is provided a diac element $D_T$ to control the gate electrode of the triac $T_C$. When the diac element $D_T$ breaks down, it will provide a triggering signal to the gate electrode of triac $T_C$ for controlling the output level provided by the lamp.

TABLE V

LATCHED CONDITIONS
(all $\overline{R}$ and $\overline{S}$ = '1')
(all R and S = '0')

| latch code | $Q_1$ | $Q_2$ | $Q_3$ | $Q_4$ | $Q_5$ | $Q_6$ | $Q_7$ | $Q_8$ | $Q_9$ | $Q_{10}$ | $Q_{11}$ | $Q_{12}$ | $\overline{Q}_1$ | $\overline{Q}_2$ | $\overline{Q}_3$ | $\overline{Q}_4$ | $\overline{Q}_5$ | $\overline{Q}_6$ | $\overline{Q}_7$ | $\overline{Q}_8$ | $\overline{Q}_9$ | $\overline{Q}_{10}$ | $\overline{Q}_{11}$ | $\overline{Q}_{12}$ | led ind j |
|---|---|---|---|---|---|---|---|---|---|---|---|---|---|---|---|---|---|---|---|---|---|---|---|---|---|
| 0 | 0 | 0 | 0 | 0 | 0 | 0 | 0 | 0 | 0 | 0 | 0 | 0 | 1 | 1 | 1 | 1 | 1 | 1 | 1 | 1 | 1 | 1 | 1 | 1 | I12 |
| 1 | 0 | 0 | 0 | 0 | 0 | 0 | 0 | 0 | 0 | 0 | 0 | 1 | 1 | 1 | 1 | 1 | 1 | 1 | 1 | 1 | 1 | 1 | 1 | 0 | I11 |
| 2 | 0 | 0 | 0 | 0 | 0 | 0 | 0 | 0 | 0 | 0 | 1 | 1 | 1 | 1 | 1 | 1 | 1 | 1 | 1 | 1 | 1 | 1 | 0 | 0 | I10 |
| 3 | 0 | 0 | 0 | 0 | 0 | 0 | 0 | 0 | 0 | 1 | 1 | 1 | 1 | 1 | 1 | 1 | 1 | 1 | 1 | 1 | 1 | 0 | 0 | 0 | I9 |
| 4 | 0 | 0 | 0 | 0 | 0 | 0 | 0 | 0 | 1 | 1 | 1 | 1 | 1 | 1 | 1 | 1 | 1 | 1 | 1 | 1 | 0 | 0 | 0 | 0 | I8 |
| 5 | 0 | 0 | 0 | 0 | 0 | 0 | 0 | 1 | 1 | 1 | 1 | 1 | 1 | 1 | 1 | 1 | 1 | 1 | 1 | 0 | 0 | 0 | 0 | 0 | I7 |
| 6 | 0 | 0 | 0 | 0 | 0 | 0 | 1 | 1 | 1 | 1 | 1 | 1 | 1 | 1 | 1 | 1 | 1 | 1 | 0 | 0 | 0 | 0 | 0 | 0 | I6 |
| 7 | 0 | 0 | 0 | 0 | 0 | 1 | 1 | 1 | 1 | 1 | 1 | 1 | 1 | 1 | 1 | 1 | 1 | 0 | 0 | 0 | 0 | 0 | 0 | 0 | I5 |
| 8 | 0 | 0 | 0 | 0 | 1 | 1 | 1 | 1 | 1 | 1 | 1 | 1 | 1 | 1 | 1 | 1 | 0 | 0 | 0 | 0 | 0 | 0 | 0 | 0 | I4 |
| 9 | 0 | 0 | 0 | 1 | 1 | 1 | 1 | 1 | 1 | 1 | 1 | 1 | 1 | 1 | 1 | 0 | 0 | 0 | 0 | 0 | 0 | 0 | 0 | 0 | I3 |
| 10 | 0 | 0 | 1 | 1 | 1 | 1 | 1 | 1 | 1 | 1 | 1 | 1 | 1 | 1 | 0 | 0 | 0 | 0 | 0 | 0 | 0 | 0 | 0 | 0 | I2 |
| 11 | 0 | 1 | 1 | 1 | 1 | 1 | 1 | 1 | 1 | 1 | 1 | 1 | 1 | 0 | 0 | 0 | 0 | 0 | 0 | 0 | 0 | 0 | 0 | 0 | I1 |
| 12 | 1 | 1 | 1 | 1 | 1 | 1 | 1 | 1 | 1 | 1 | 1 | 1 | 0 | 0 | 0 | 0 | 0 | 0 | 0 | 0 | 0 | 0 | 0 | 0 | I0 |

TABLE VI

SYSTEM TRANSITIONS
active input/resulting latch code

| sense input | previous latch code | | | | | | | | | | | | |
|---|---|---|---|---|---|---|---|---|---|---|---|---|---|
| | 0 | 1 | 2 | 3 | 4 | 5 | 6 | 7 | 8 | 9 | 10 | 11 | 12 |
| $P_1$ | $S_1/12$ | $S_1/12$ | $S_1/12$ | $S_1/12$ | $S_1/12$ | $S_1/12$ | $S_1/12$ | $S_1/12$ | $S_1/12$ | $S_1/12$ | $S_1/12$ | $S_1/12$ | NC |
| $P_2$ | $\bar{S}_2/11$ | $\bar{S}_2/11$ | $\bar{S}_2/11$ | $\bar{S}_2/11$ | $\bar{S}_2/11$ | $\bar{S}_2/11$ | $\bar{S}_2/11$ | $\bar{S}_2/11$ | $\bar{S}_2/11$ | $\bar{S}_2/11$ | $\bar{S}_2/11$ | NC | NC |
| $P_3$ | $S_3/10$ | $S_3/10$ | $S_3/10$ | $S_3/10$ | $S_3/10$ | $S_3/10$ | $S_3/10$ | $S_3/10$ | $S_3/10$ | $S_3/10$ | NC | NC | NC |
| $P_4$ | $\bar{S}_4/9$ | $\bar{S}_4/9$ | $\bar{S}_4/9$ | $\bar{S}_4/9$ | $\bar{S}_4/9$ | $\bar{S}_4/9$ | $\bar{S}_4/9$ | $\bar{S}_4/9$ | $\bar{S}_4/9$ | NC | NC | NC | NC |
| $P_5$ | $S_5/8$ | $S_5/8$ | $S_5/8$ | $S_5/8$ | $S_5/8$ | $S_5/8$ | $S_5/8$ | $S_5/8$ | NC | NC | NC | NC | $R_1/11$ |
| $P_6$ | $\bar{S}_6/7$ | $\bar{S}_6/7$ | $\bar{S}_6/7$ | $\bar{S}_6/7$ | $\bar{S}_6/7$ | $\bar{S}_6/7$ | $\bar{S}_6/7$ | NC | NC | NC | NC | $\bar{R}_2/10$ | $\bar{R}_2/10$ |
| $P_7$ | $S_7/6$ | $S_7/6$ | $S_7/6$ | $S_7/6$ | $S_7/6$ | $S_7/6$ | NC | NC | NC | NC | $R_3/9$ | $R_3/9$ | $R_3/9$ |
| $P_8$ | $\bar{S}_8/5$ | $\bar{S}_8/5$ | $\bar{S}_8/5$ | $\bar{S}_8/5$ | $\bar{S}_8/5$ | NC | NC | NC | NC | $\bar{R}_4/8$ | $\bar{R}_4/8$ | $\bar{R}_4/8$ | $\bar{R}_4/8$ |
| $P_9$ | $S_9/4$ | $S_9/4$ | $S_9/4$ | $S_9/4$ | NC | NC | NC | NC | $R_5/7$ | $R_5/7$ | $R_5/7$ | $R_5/7$ | $R_5/7$ |
| $P_{10}$ | $\bar{S}_{10}/3$ | $\bar{S}_{10}/3$ | $\bar{S}_{10}/3$ | NC | NC | NC | NC | $\bar{R}_6/6$ | $\bar{R}_6/6$ | $\bar{R}_6/6$ | $\bar{R}_6/6$ | $\bar{R}_6/6$ | $\bar{R}_6/6$ |
| $P_{11}$ | $S_{11}/2$ | $S_{11}/2$ | NC | NC | NC | NC | $R_7/5$ | $R_7/5$ | $R_7/5$ | $R_7/5$ | $R_7/5$ | $R_7/5$ | $R_7/5$ |
| $P_{12}$ | $\bar{S}_{12}/1$ | NC | NC | NC | NC | $\bar{R}_8/4$ | $\bar{R}_8/4$ | $\bar{R}_8/4$ | $\bar{R}_8/4$ | $\bar{R}_8/4$ | $\bar{R}_8/4$ | $\bar{R}_8/4$ | $\bar{R}_8/4$ |
| $P_{13}$ | NC | NC | NC | NC | $R_9/3$ | $R_9/3$ | $R_9/3$ | $R_9/3$ | $R_9/3$ | $R_9/3$ | $R_9/3$ | $R_9/3$ | $R_9/3$ |
| $P_{14}$ | NC | NC | NC | $\bar{R}_{10}/2$ | $\bar{R}_{10}/2$ | $\bar{R}_{10}/2$ | $\bar{R}_{10}/2$ | $\bar{R}_{10}/2$ | $\bar{R}_{10}/2$ | $\bar{R}_{10}/2$ | $\bar{R}_{10}/2$ | $\bar{R}_{10}/2$ | $\bar{R}_{10}/2$ |
| $P_{15}$ | NC | NC | $R_{11}/1$ | $R_{11}/1$ | $R_{11}/1$ | $R_{11}/1$ | $R_{11}/1$ | $R_{11}/1$ | $R_{11}/1$ | $R_{11}/1$ | $R_{11}/1$ | $R_{11}/1$ | $R_{11}/1$ |
| $P_{16}$ | NC | $\bar{R}_{12}/0$ | $\bar{R}_{12}/0$ | $\bar{R}_{12}/0$ | $\bar{R}_{12}/0$ | $\bar{R}_{12}/0$ | $\bar{R}_{12}/0$ | $\bar{R}_{12}/0$ | $\bar{R}_{12}/0$ | $\bar{R}_{12}/0$ | $\bar{R}_{12}/0$ | $\bar{R}_{12}/0$ | $\bar{R}_{12}/0$ |

(areas marked 'NC' indicate no change in output state)

Table VI shows the system transitions for FIG. 7 wherein the latch codes identified in the left hand column of Table V are identified across the top as the previous latch code in Table VI. The sense inputs represented in Table VI are identified in terms of the selector elements $P_1$ through $P_{16}$. Accordingly, the Table VI clearly defines the operation of the latching elements L1 through L12 when a particular selection element is actuated and illustrates what occurs when the latches are sitting at any one of the thirteen previous codes. For example, when a selection element $P_1$ is operated, and the previous latch code is all 0's, latch code 12 is generated by input $S_1$ and latch code 12 is noted in Table V as all 1's. Similarly, when selector element $P_2$ is operated and the previous latch code is all 0's, latch code 11 is generated by input $\bar{S}_2$ which means that output $Q_1$ is 0 and outputs $Q_2$ through $Q_{12}$ are all 1's. Similarly, if the previous latch code is latch code 1 and the selector element $P_2$ is operated, then latch code 11 is also generated to form the output pattern identified in Table V. It will be noted that for all of the previous latch codes from 0 through 10, when operating selection element $P_2$, latch code 11 will be produced. Columns 11 and 12, representing previous latch codes 11 and 12, will not provide a change and are so identified by the letters NC. The letters NC also represent the effective hysteresis region of the circuit for each latch code.

TABLE VII.

DIGITAL TO ANALOG CONVERSION
resistive voltage division

| latch code | $R_{low}$ | $R_{high}$ |
|---|---|---|
| 12 | Ron | R1//R2//R3//R4//R5//R6//R7//R8//R9//R10//R11//R12//Roff |
| 11 | Ron//R1 | R2//R3//R4//R5//R6//R7//R8//R9//R10//R11//R12//Roff |
| 10 | Ron//R1//R2 | R3//R4//R5//R6//R7//R8//R9//R10//R11//R12//Roff |
| 9 | Ron//R1//R2//R3 | R4//R5//R6//R7//R8//R9//R10//R11//R12//Roff |
| 8 | Ron//R1//R2//R3//R4 | R5//R6//R7//R8//R9//R10//R11//R12//Roff |
| 7 | Ron//R1//R2//R3//R4//R5 | R6//R7//R8//R9//R10//R11//R12//Roff |
| 6 | Ron//R1//R2//R3//R4//R5//R6 | R7//R8//R9//R10//R11//R12//Roff |
| 5 | Ron//R1//R2//R3//R4//R5//R6//R7 | R8//R9//R10//R11//R12//Roff |
| 4 | Ron//R1//R2//R3//R4//R5//R6//R7//R8 | R9//R10//R11//R12//Roff |
| 3 | Ron//R1//R2//R3//R4//R5//R6//R7//R8//R9 | R10//R11//R12//Roff |
| 2 | Ron//R1//R2//R3//R4//R5//R6//R7//R8//R9//R10 | R11//R12//Roff |
| 1 | Ron//R1//R2//R3//R4//R5//R6//R7//R8//R9//R10//R11 | R12//Roff |
| 0 | Ron//R1//R2//R3//R4//R5//R6//R7//R8//R9//R10//R11//R12 | Roff |

// = parallel

To better appreciate power control to the lamp L the Table VII, which defines the digital-to-analog conversion for energizing the lamp L, can be examined. It may be assumed that the load on the control voltage is negligible and that the conversion resistors are pulled almost to the value of the supply voltage. The transistors $T_N$ and $T_P$ alternately supply a charging current to the capacitor $C_P$, depending on the polarity of the power line. During the time that each of the transistors $T_N$ and $T_P$ is conductive, it may be assumed that the base current is small so that the emitter current is approximately equal to the collector current and that the base emitter junction voltage drop is negligible. The resulting charge currents can then be defined by the following relationships:

$$I_P \approx \frac{V_{control}}{R_{pg}} \quad I_N \approx \frac{V_{control}}{R_{ng}}$$

Table VII shows the resistive voltage division based on the resistors $R_{ON}$, R1 through R12, and $R_{OFF}$ for the various latch codes to provide the necessary digital-to-analog conversion. In the arrangement of the power control circuit for the lamp L, it should be noted that the resistor $R_P$ connected in the circuit path to the capacitor $C_P$ is only for isolation purposes and has no significant effect on the current flow for charging the capacitor $C_P$ so that the voltage on the capacitor $C_P$ rises from the voltage remaining on the capacitor $C_P$ due to the previous half cycle in accordance with the current provided by transistors $T_N$ and $T_P$.

The diac $D_T$ will apply a current pulse to the gate electrode of the triac $T_C$ in either polarity when a trigger voltage characteristic of the diac $D_T$ is reached. It will be assumed that the trigger voltage for the diac $D_T$ is the same in both directions. Under these assumed conditions the control currents $I_P$ and $I_N$ can be approximately equal and opposite. When the diac $D_T$ applies a pulse to the gate electrode of the triac $T_C$, the triac will be rendered conductive and supply power to the lamp L for the remainder of the half cycle so that the amount of power supplied to the lamp is determined by the time interval occurring in the half cycle before the diac $D_T$ is rendered conductive. It will be appreciated that in order to obtain an output voltage to the lamp L this time interval must be less than the duration of the half cycle and the shorter this time interval is, the more power is delivered to the lamp L since the lamp is energized over a longer portion of the half cycle and, accordingly, the brighter the light output will be. The brightness then can be seen to be directly proportional to the control voltage produced by the analog converter so that the brightness of the lamp increases as the control voltage increases. This results by operating the upper arrangement of selection elements and to produce a dimmer output by touching the lower group of selection elements.

What is claimed is:

1. A data latch comprising
   a bistable "logical" latching element, n, having a pair of input terminals coupled to be responsive to an individual triggering signal for "setting" the latching element to a preselected one of its bistable states in response to a triggering signal coupled to either one of said input terminals,
   said latching element including a pair of output terminals coupled thereto to signal the state of the bistable latching element, one of the output terminals representing the "setting" and the other terminal being complementary thereto and representing the "resetting" of the latching element,
   another pair of input terminals coupled to said latching element and coupled to be responsive to an individual triggering signal for "resetting" the latching element to the other one of the bistable states in response to a triggering signal coupled to either one of the another pair of input terminals,
   a plurality of bistable "logical" latching elements constructed and defined as the first mentioned latching element n with the same two pairs of input terminals and the pair of output terminals,
   the plurality of latching elements being arranged in sequence on the opposite sides of the n latching element and being respectively identified as $n-1$, $n-2$, etc. and $n+1$, $n+2$, etc., elements,
   circuit means coupled to the "setting" one of the output terminals of the first mentioned n latching element to one of the "setting" input terminals for the $n+1$ latching element,
   circuit means coupled to the "resetting" one of the output terminals of the first mentioned, n, latching element to one of the "resetting" input terminals for the $n-1$ latching element,
   circuit means coupled to the "setting" one of the output terminals of the $n-1$ latching element to one of the "setting" input terminals for the n latching element,
   circuit means coupled to a "setting" one of the input terminals of the $n-1$ latching element adapted to be connected to one of the terminals for a source of reference potential or the $n-2$ "setting" output terminal,
   circuit means coupled to the "resetting" one of the output terminals of the $n+1$ latching element to one of the "resetting" input terminals for the n latching element,
   circuit means coupled to a "resetting" one of the input terminals for the $n+1$ latching element adapted to be connected to one of the terminals for a source of reference potential or the $n+2$ "resetting" output terminal,
   individual latching selection elements, the number of selection elements being one greater than the number of said latching elements, each selection element being coupled to a source of potential for applying a preselected potential to at least a single latching element when in the static condition and a triggering signal to at least one of the latching elements when selectively operated,
   circuit means coupling an individual latching selection element to a "resetting" input terminal of the last of said $n+1$ series of elements for resetting all of the latching elements to signal the binary pattern 0000—when selectively operated,
   circuit means for coupling an individual latching selection element to a "setting" input terminal of the last of said $n-1$ series of elements for setting all of the latching elements to signal the binary pattern 1111—when selectively operated,
   individual circuit means for coupling an individual latching selection element to a "resetting" input terminal of the n latch and to a "setting" input terminal of the $n+1$ latch,
   individual circuit means for coupling an individual latching selection element to a "setting" input terminal of the n latch and to a "resetting" input terminal of the $n-1$ latch,
   the latches being constructed and defined to sequentially produce the binary patterns 0000, 0001, 0011, 0111, 1111 and vice-versa when sequentially operating the selection elements from one end to the opposite end, the operation is further characterized by the generation of a unique binary pattern in response to the operation of a selection element whereby the operation of a selection element to "set" the coupled latch to a binary 1 will cause all latches arranged in ascending order to be set to a binary 1 and when a selection element is operated to "reset" a latch to a binary 0 will cause all latches arranged in decending order to be reset to a binary 0.

2. A method of electronically generating a multiplicity of unique binary output patterns including the steps of
   providing n data latches in series for signalling a binary character and its complement in response to the "logical" combination of input signals uniquely coupled to a data latch, each data latch including a set and a reset input terminal and a corresponding set and reset output terminal, the multiplicity of data latching defining $n+1$ stable states ranging from all binary characters of one kind to all binary characters of the other kind, with a change of one binary character in progressing step-by-step from all binary characters of one kind to all binary characters of the other kind with the number of steps being defined by the numerical value of n representing the number of data latches plus one, propagating an electrical signal representative of the binary character signalled by the set output terminal of the data latch at one end of the series of data latches as an additional input setting signal to the adjacent data latch, repeating the propagation step from said adjacent data latch to the next successive data latches in accordance with the number n of data latches minus one, propagating an electrical signal representative of the binary character signalled by the reset output terminal of the data latch arranged at the opposite end of the series of data latches from said one end as an additional resetting signal to the adjacent data latch, repeating the latter mentioned propagation step from said adjacent data latch to the next successive data latch in accordance with the number n of data latches minus one, individually coupling a static signal to the set and reset input terminals for the data latches to normally maintain the outputs of the data latches in a preselected pattern of binary characters, and selecting and momentarily triggering an individual set or reset input terminal for a data latch to change the output binary pattern to generate and latch the generated pattern with the number of binary characters of one kind being represented in the output pattern in accordance with the location of the selected data latch in the sequential series of latches so that all of the data latches on one side of the selected data latch represents the same binary character and all of the data latches arranged on the opposite side of the selected data latch represents the opposite binary character.

3. A method of electronically generating a multiplicity of unique binary output patterns including the steps of producing a preselected plurality of binary latching elements with each latching element having a pair of "setting" input terminals and a pair of "resetting" input terminals and a pair of "set" and "reset" output terminals for complementarily signalling the binary state of the latch, arranging the binary latching elements in a linear sequence with one "set" output terminal for each latch coupled to the "set" input terminal for the next lower sequential latch to cause it to be "set" when the next higher latch is "set" and with one "reset" output terminal for each latch coupled to the "reset" input terminal of the next higher latch to cause it to be "reset" when the next lower latch is reset, providing individual selection elements for individually applying a selection signal to the coupled latch to change the state thereof, and causing the latch elements to respond to the operation of a selection element whereby when the operated selection element "sets" the coupled latch to the binary 1 it will cause all latches arranged at each of the lower sequential positions to be set to a binary 1 and when the operated selection element "resets" a coupled latch to a binary 0 all latches arranged at each of the higher sequential positions are reset to a binary 0 whether the selection elements are operated in sequence or at random, the binary pattern derived from the output terminals varying between all binary 0's and all binary 1's and increasing or decreasing by a binary 1 in progressing from one end of the sequence of latches to the other end.

4. A method of digitally actuating a load to vary the potential applied to the load including the steps of producing a preselected plurality of binary latching elements with each latching element having a pair of "setting" input terminals and a pair of "resetting" input terminals and a pair of "set" and "reset" output terminals for complementarily signalling the binary state of the latch, arranging the binary latching elements in a linear sequence with one "set" output terminal for each latch coupled to the "set" input terminal for the next lower sequential latch to cause it to be "set" when the next higher latch is "set" and with one "reset" output terminal for each latch coupled to the "reset" input terminal of the next higher latch to cause it to be "reset" when the next lower latch is reset, providing individual selection elements for individually applying a selection signal to the coupled latch to change the state thereof, causing the latch elements to respond to the operation of a selection element whereby when the operated selection element "sets" the coupled latch to a binary 1 it will cause all latches arranged at each of the lower sequential positions to be set to a binary 1 and when the operated selection element "resets" a coupled latch to a binary 0 all latches arranged at each of the higher sequential positions are reset to a binary 0 whether the selection elements are operated in sequence or at random, the binary pattern derived from the output terminals varying between all binary 0's and all binary 1's and increasing or decreasing by a binary 1 in progressing from one end of the sequence of latches to the other end, coupling a digital to analog converting element to be responsive to the pattern of binary signals appearing on the output terminals for the latch element to provide a corresponding analog signal in accordance with the unique binary pattern received, and energizing a load device with the resulting analog signal.

5. A method of digitally actuating a load to vary the potential applied to the load as defined in claim 4 wherein the load device is an electrical lamp.

6. A method of electronically generating a multiplicity of unique binary output patterns including the steps of arranging a multiplicity of data latches in a series for signalling binary characters in a latched condition at its output terminals, providing "setting" and "resetting" input terminals for the data latches for individually switching the binary characters at the output terminals from one kind of binary character to the other kind of binary character, coupling preselected terminals of the data latches to cause a latch element that has been "set" to "set" the output terminals of all the data latches arranged on one side of the "set" latch and to cause a latch element that has been "reset" to "reset" all the data latches arranged on the side opposite to said one side, coupling an individual selection element to one of the data latches arranged at one end of the series of data latches to normally maintain and "reset" the output terminals of all of the data latches to signal the same kind of binary character when operated, coupling an individual selection element to one of the data latches arranged at the opposite end of the series of data latches from said one end to "set" the individual latch to cause the output terminal to said individual latch and thereby the output terminals of all of the data latches to signal the same binary character, the complementary character from the first mentioned same kind, when operated, coupling an individual selection element to each one of the remaining data latches arranged intermediate said end data latches for correspondingly setting and resetting the data latches in accordance with the relative position of the "set" or "reset" data latch when its individual "set" or "reset" selection element is operated, and operating an individual selection element for generating a preselected individual binary output pattern in accordance with the position of the operated selection element.

7. A data latch comprising a "logical" latching element, n, comprising a pair of "logical" elements, each of the "logical" elements being capable of signalling the set or reset states of the corresponding "logical" element, one of the "logical" elements for the n element having a "set" input terminal coupled thereto and a "set" output terminal, the other "logical" element for the n element having a "reset" input terminal coupled thereto and a "reset" output terminal, circuit means for coupling the "set" output terminal of said one "logical" element as an input signal to the other "logical" element, circuit means for coupling the "reset" output terminal of said other "logical" element as an input signal to said one "logical" element, a logical latching element, $n+1$, comprising a pair of "logical" elements constructed and defined the same as the n latching element with two logical elements defining "set" and "reset" logical elements, signal propagation means coupled to the "set" output terminal of said one logical element for the n latching element to provide the binary complement of the output signal to the "set" logical element for the $n+1$ latching element as an input signal, signal propagation means coupled to the "reset" output terminal of the "reset" "logical" element for the $n+1$ latching element to provide the binary complement of the output signal to said other "logical" element for the n latching element as an input signal, input circuit means for providing a signal of one binary kind to the reset "logical" element of said $n+1$ latch as an input signal and operative to momentarily couple a signal of the other binary kind for resetting the output state of said "reset" logical element, input circuit means for providing a signal of one binary kind to the set "logical" element of said $n+1$ latch as an input signal and to the "reset" input terminal of said another logical element for the n latch substantially simultaneously and operative to momentarily couple a signal of the other kind to said logical elements, and input circuit means for providing a signal of one binary kind to the "set" input terminal for said one logical element of the n latch and operative to momentarily couple a signal of the other binary kind for setting the output state of said one "logical" element.

* * * * *

UNITED STATES PATENT OFFICE
CERTIFICATE OF CORRECTION

Patent No. 4,334,212　　　　　　　Dated　June 8, 1982

Inventor(s)　Fred R. Wright

It is certified that error appears in the above-identified patent and that said Letters Patent are hereby corrected as shown below:

Column 8, line 60, "$O_{n+1}$" should show -- $Q_{n+1}$ --;

Column 9, line 9, "$\bar{Q}_{n+1}$" should show -- $Q_{n+1}$ --;

Column 9, line 12, "$Q_{n+1}$" should show -- $\bar{Q}_{n+1}$ --;

Column 11, line 28, "190" should show -- # --;

Column 13, line 6, "the" second occurrence, should read --line--

Column 15, line 34, "1-12" should show -- 0-12 --;

Column 23, line 6, "to" second occurrence, should read -- of --.

Signed and Sealed this

Twenty-first Day of December 1982

[SEAL]

Attest:

GERALD J. MOSSINGHOFF

Attesting Officer　　Commissioner of Patents and Trademarks